United States Patent [19]

Allen

[11] Patent Number: 4,518,678
[45] Date of Patent: May 21, 1985

[54] SELECTIVE REMOVAL OF COATING MATERIAL ON A COATED SUBSTRATE

[75] Inventor: Landon K. Allen, Sunnyvale, Calif.

[73] Assignee: Advanced Micro Devices, Inc., Sunnyvale, Calif.

[21] Appl. No.: 562,241

[22] Filed: Dec. 16, 1983

[51] Int. Cl.$^3$ .................. B05D 3/12; G03C 1/76; G03C 3/00

[52] U.S. Cl. .................. 430/311; 427/240; 427/273

[58] Field of Search ............. 427/240, 273; 430/311

[56] References Cited

U.S. PATENT DOCUMENTS 4,113,492  9/1978  Sato et al. .................. 427/273 X Primary Examiner—Michael R. Lusignan
Attorney, Agent, or Firm—Patrick T. King; J. Vincent Tortolano

[57] ABSTRACT

In accordance with the invention, an improvement in the process for the production of a plurality of semiconductor devices from a single substrate comprises contacting at least one surface of the substrate adjacent the peripheral edge thereof with means capable of rendering the coating material into a selectively more easily removable form than the remainder of the coating material. Selective peripheral portions of the coating material are then removed which mitigates the inadvertant dislodgement of coating particles from the peripheral portion of the substrate during subsequent processing of the coated substrate. In a preferred embodiment, the coating material is removed by contacting the peripheral portions of the coated substrate with a chemical which is a solvent for the coating.

12 Claims, 5 Drawing Figures

SELECTIVE REMOVAL OF COATING MATERIAL ON A COATED SUBSTRATE

BACKGROUND OF THE INVENTION

1. Technical Field of the Invention

This invention relates to removal of coating material from a coated substrate. More particularly, this invention relates to the selective removal of photosensitive coating material from the periphery of a substrate or wafer used to produce micro integrated circuit chips.

2. Background Art

In the production of micro integrated circuit components or "chips" it is customary to coat a wafer or substrate with a photosensitive material and then expose the coated substrate to a light source imaged through a pattern or mask. Portions of the coating exposed to the light source become chemically altered to permit selective removal of either the exposed portion of the coating or the unexposed portion by a solvent.

The resultant selectively exposed substrate is then subjected to further processing steps, such as etching, diffusion, plating or the like, to provide the layers of microcircuitry which will eventually result in the production of a number of integrated circuits or chips on the substrate.

Because of the minute spacing between circuit components and conductor paths, introduction of foreign particles, such as dust or the like, is scrupulously avoided. A single particle of dust on the substrate, for example, may result in the malfunction and, therefore, loss of one of the chips on the substrate. A number of such foreign particles on a substrate may therefore result in a serious decrease in the yield from the wafer or substrate.

Recently it has been noted that some of these losses apparently occur due to the presence of particles of photoresist coating not exposed to light on portions of the coating where the coating has been exposed to light, i.e., not corresponding to the desired light pattern imaged on the coating. The presence of such particles can therefore result in irregularities producing defects in the particular chips on the substrate where these particles lodge.

The photoresist coating material is customarily applied as a liquid to the center of a spinning circular substrate and is evenly spread across the surface by centrifugal forces. A slight amount of the coating flows over the end edge of the substrate and onto the periphery of the lower surface. This portion of the coating is usually not as uniform.

Microscopic examination of the uneven surfaces of the loose particles of photoresist coating noted above indicate that one source of such particles is apparently the end edges of the substrate. It has been surmised that the presence of these particles is the result of handling of the substrates during processing which may result in the dislodgment or flaking off of the coating adjacent the periphery of the coated substrate with at least some of the dislodged particles becoming inadvertently scattered over the remainder of the coated substrate resulting in eventual defects.

SUMMARY OF THE INVENTION

It is therefore an object of the invention to provide a process for the selective removal of coating material adjacent the peripheral edge of a coated substrate.

It is another object of the invention to provide a process which will render a portion of the coating material adjacent the periphery of a coated substrate more easily removable than the remainder of the coating.

It is yet another object of the invention to provide a process for the application of a chemical to one surface of a coating substrate adjacent the end edge to selectively remove coating material from the end edge of the substrate.

It is a further object of the invention to provide a process for the application of a chemical to the peripheral portion of one surface of a coated substrate to selectively remove a peripheral portion of the coating adjacent the end edge of the substrate on both surfaces of the substrate.

These and other objects of the invention will be apparent from the following description and accompanying drawings.

In accordance with the invention, an improvement in the process for the production of a plurality of semiconductor devices from a single substrate comprises contacting at least one surface of a coated substrate adjacent the peripheral edge thereof with means capable of selectively rendering a portion of the coating material into a selectively more easily removable form than the remainder of the coating material. Selective peripheral portion of the coating material are then removed which mitigates the inadvertant dislodgment of coating particles from the periperal portion of the substrate during subsequent processing of the coated substrate.

In a preferred embodiment, the coating material is removed by contacting the peripheral portions of the coated substrate with a chemical which is a solvent for the coating.

DESCRIPTION OF THE INVENTION

Figure 2:
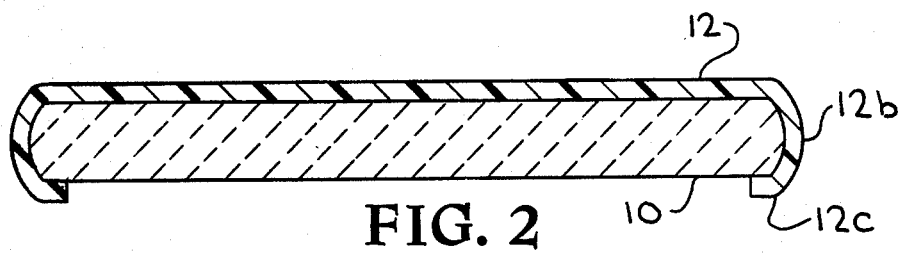
FIG. 2 is a cross-sectional side view of a typical coated substrate or wafer.

The invention provides a novel process for the removal of peripheral portions of coating from a coated substrate such as typical substrate or wafer 10 shown in FIG. 2. A coating 12, which usually comprises a photosensitive organic coating material, is generally applied to the top surface of substrate 10. However, the coating also typically extends around the end edge of the substrate as shown at 12b. and onto a peripheral portion of the bottom surface of substrate 10 forming a peripheral band 12c.

Figure 3:
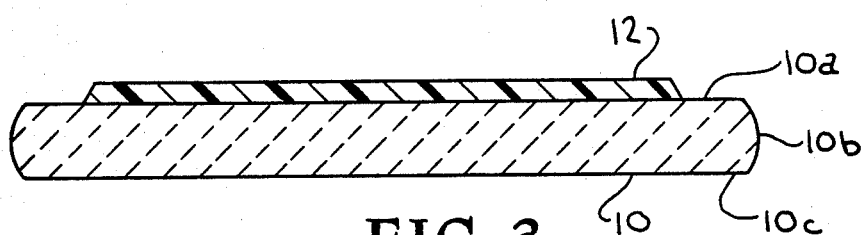
FIG. 3 is a cross-sectional side view of the wafer of FIG. 2 with peripherial portions of the coating removed in accordance with the invention.

In contrast, the coated substrate illustrated in FIG. 3, after carrying out the process of the invention, has a peripheral band of exposed substrate 10a on the upper surface of substrate 10 and the end edge 10b and peripheral portion 10c on the bottom surface of substrate 10 are also free of coating material.

Figure 1:
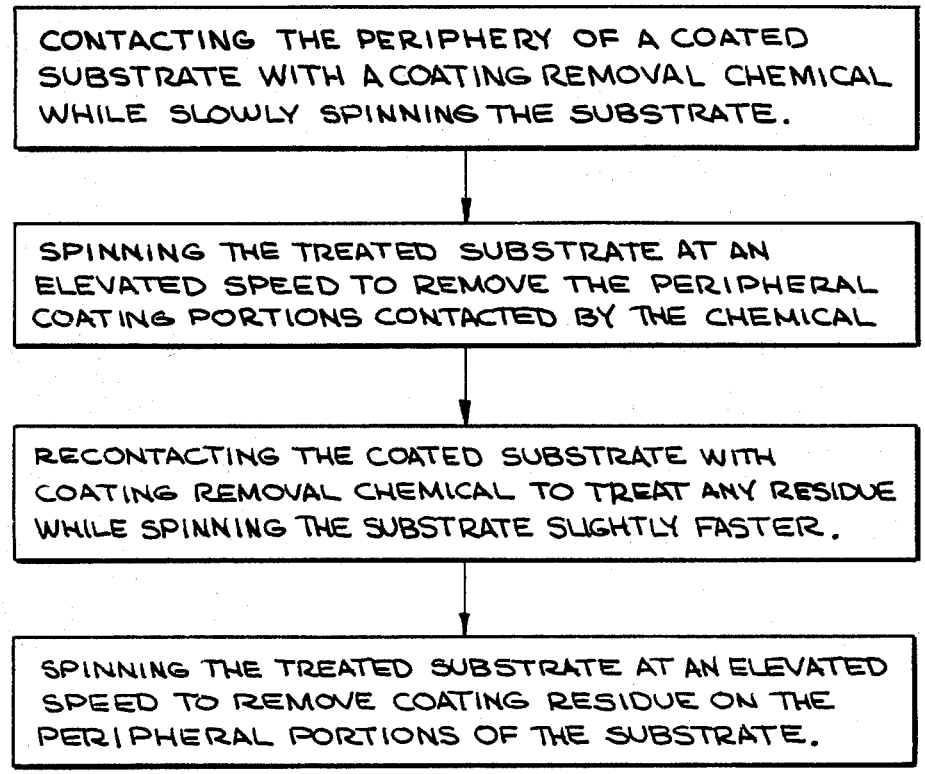
FIG. 1 is a flow sheet illustrating the process steps of a preferred embodiment of the invention.

While several specific means for carrying out the process will be described, reference will now be made to FIGS. 4 and 5 which illustrate the preferred embodiment of the process as set forth in the flow sheet (FIG. 1).

Figure 4:
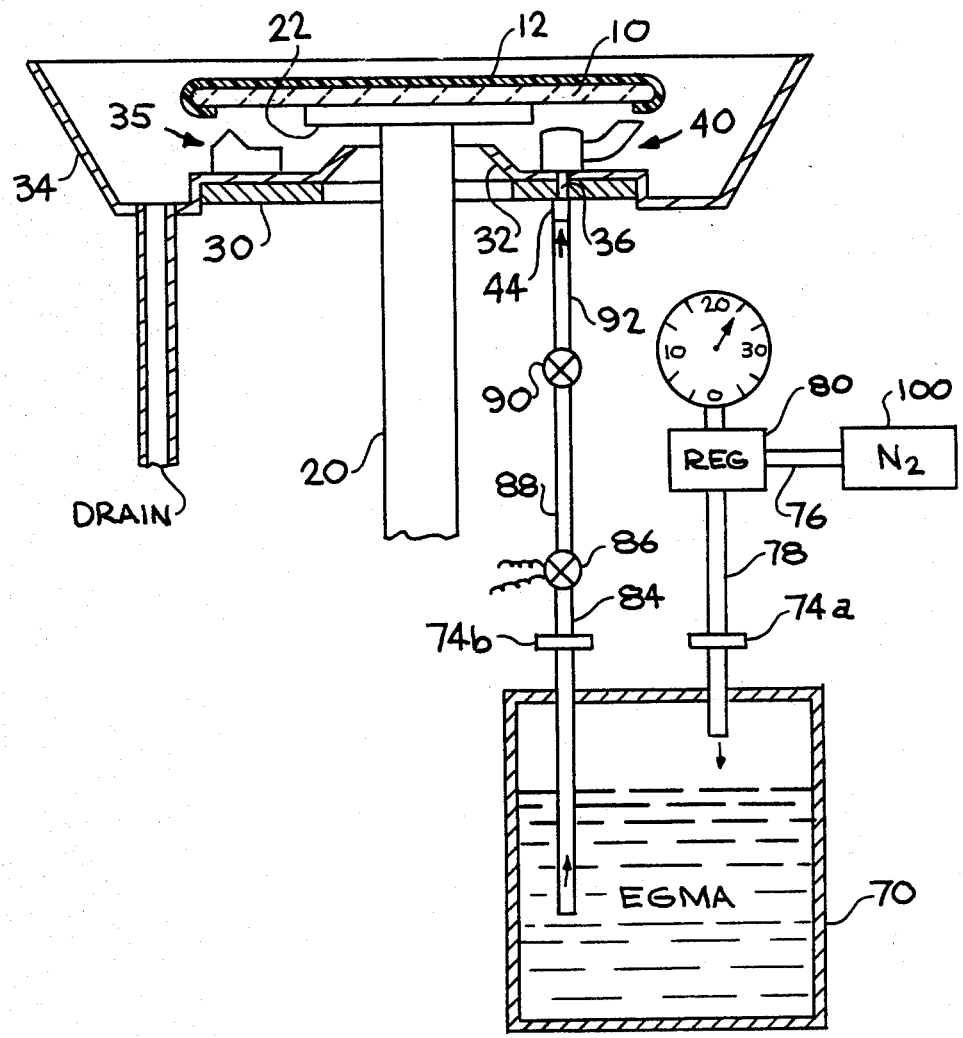
FIG. 4 is a schematic illustration of the equipment used to carry out the preferred embodiment of the process of the invention.
Figure 5:
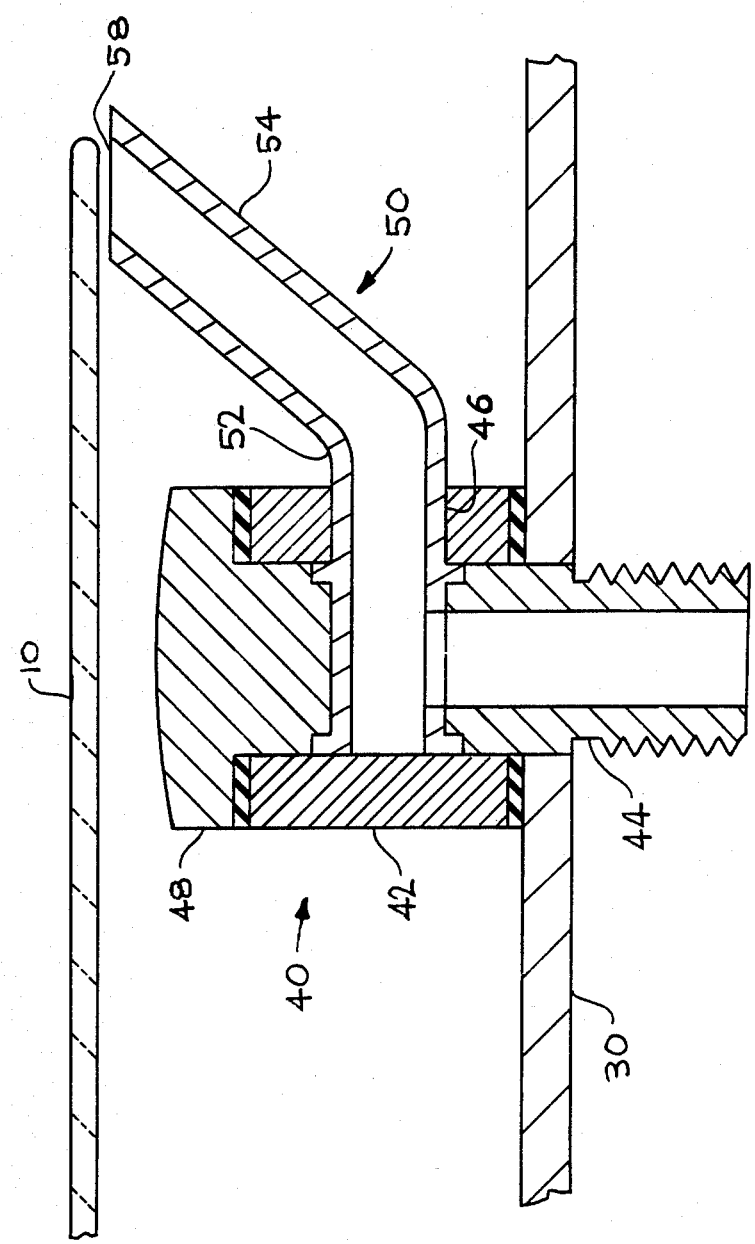
FIG. 5 is a side view in cross section of the nozzle assembly generally shown in FIG. 4.

Referring to FIGS. 4 and 5, a substrate or wafer 10 is shown having a coating 12 on its upper surface. Substrate 10 is shown releasably affixed to a plate 22 of a vacuum chuck 20 which, in turn, is coupled to a motor means (not shown) to spin chuck 20 and substrate 10 carried thereon. A circular drain plate 30 having a raised internal lip 32 and an external lip 34 is coaxially mounted beneath top plate 22 to retain excess coating material as it is applied to the top surface of substrate 10. Also, a raised baffle 35 is mounted to drainplate 30 under wafer 10 to radially surround chuck 20 and vacuum plate 22 to prevent chemical backstreaming from reaching chuck 20 and vacuum plate 22.

Mounted through a bore 36 in drain plate 30 is a nozzle assembly 40 comprising a pipe 44 having a collar 42 affixed thereto on the upper side of drain plate 30. An end cap 48 is threadedly received on the end of collar 42.

Mounted in a side bore 46 in collar 42 is a nozzle 50 having a first portion 52 positioned normal to collar 42 and generally pointed toward the outer edge of substrate 10. A second portion 54 of nozzle 50 is fixed to about a 45° angle to portion 52 and a nozzle tip 58 thereon terminates at a point just beneath and adjacent the end edge of substrate 10. The positioning of nozzle tip 58 of nozzle 50 relative to substrate 10 is important relative to the dispensing of chemical to remove the coating on substrate 10 as will be discussed below.

Referring again to FIG. 2, the coating removal chemical is dispensed from a pressurized reservoir 70 which is provided with a pair of quick disconnect fittings 74a and 74b. Reservoir 70 is pressurized by a non-reactive gas, such as nitrogen, which is fed from a source 100 through a tube 76 to a pressure regulator 80 to reduce the pressure to about 25 psi. A tube 78 connects regulator 80 with quick disconnect 74a.

A tube 84 is connected to quick disconnect 74b and a solenoid valve 86. The chemical is then conveyed via a tube 88 to a flow restricting member 90 which may comprise a commercially available needle valve. From flow restricting member the chemical flows through a tube 92 to pipe 44 of nozzle assembly 40.

When the chemical is to be applied to coated substrate 10, solenoid valve 86 is activated and the chemical flows under pressure from reservoir 70 through tube 84, solenoid valve 86, tube 88, flow restricting member 90 and tube 92 into nozzle assembly 40. As the chemical exits nozzle 50 at nozzle tip 58, a meniscus is formed by the exiting liquid between nozzle tip 58 and the underside of substrate 10. Forming of this meniscus is expedited by closely spacing nozzle tip 58 to substrate 10. Preferably, the spacing is from 0.15 to 0.20 mm (0.006 to 0.008").

The chemical liquid then flows around the end edge of the spinning substrate and travels radially inward a slight distance on the periphery of the tip surface of wafer 10.

The amount of inward creep of the chemical liquid on the upper surface of wafer 10 has been found to be related to the rotational speed of substrate 10. If substrate 10 comprises a 4" diameter wafer rotating at a speed of 350 rpm, the chemical may travel inwardly on the top surface of the substrate approximately 1/10 of an inch. If the speed is increased, the inward creep is reduced, apparently due to centrifugal forces.

The chemical used to remove the coating must be a solvent for the coating capable of reacting quickly to dissolve the coating material during the application period and the subsequent spin removal time. A typical photoresist coating used in the semiconductor industry is a phenol-formaldehyde resin having a diazide sensitizer. For such a coating, a cellosolve acetate solvent, such as EGEMA, can be satisfactorily used.

In actual operation, a wafer 10 is placed, either manually or via an automated track, onto vacuum chuck 20. The wafer is then spun at a higher speed, e.g., about 5000 rpm for a 4" wafer, while the photoresistive coating material is centrally dispensed onto the top surface to form coating 12.

After the coating has dried, e.g., 3-6 seconds, the peripheral portion of coating 12 on the top surface of substrate or wafer 10, as well as portion 14 on the end edge of the wafer, and strip 16 on the periphery of the bottom surface of wafer 10, are removed by applying the chemical removal agent to the coated wafer via nozzle assembly 40. The chemical is dispensed for a period of about 2 to 10 seconds, preferably aout 3 to 6 seconds, while the wafer is spun at a predetermined speed depending upon the thickness of the coating layer and the diameter of the wafer.

The speed used, during the initial dispensing of the coating-removal chemical, is preselected to permit migration of the chemical around the end edge of the wafer and onto the periphery of the top surface of the wafer. The slower the speed, the further the inward migration of the chemical on the top surface resulting in a larger band of coating which will be removed. Thus, the speed is preselected to permit sufficient migration to remove a peripheral band of from about 2.54-5.1 millimeters (100-200 thousands of an inch). The speed is also somewhat dependent upon the thickness of the coating; a thicker coating requires a slightly slower speed. For example, the speed used for a 4" diameter wafer having a coating layer of about 1 micron would be approximately 300-350 rpm while the speed used for a similarly sized wafer having a 2 micron coating would be about 50 rpm less.

Following the dispensing period, the wafer is spun at a higher speed, e.g., about 2000 rpm for a 4" wafer, for from 3 seconds to about 20 seconds, preferably about 5 seconds, to remove the chemical and coating material contacted by the chemical by centrifugal forces, i.e., a centrifuging action. A longer spin time, e.g. 2 minutes, may be used, but is unnecessary.

This initial treatment and removal of coating has been found to remove a major portion of the coating in the desired area, i.e., the end edge of the wafer and a peripheral band on the top and bottom surfaces. However, it has been noted that slight amounts of coating still remain on the peripheral surfaces of the wafer as radial lines or streamers indicating that some of the coating and chemical solvent mixture apparently dries as it is centrifugally spun off the wafer at the higher speed leaving small streamers or trails of coating.

While it might be possible to prevent such occurrences by adjusting the viscosity of the chemical solvent used to remove the coating, it has been found that a second, short application of chemical to the wafer, while rotating the wafer at a speed slightly higher than that used for the first application, will satisfactorily remove such residues remaining from the first removal treatment. For example, for a 4" diameter wafer, a second dispensing of chemical through the nozzle for a period of about 1 to 10 seconds, preferably about 3 to 5 seconds, while spinning the wafer at about 400 rpm, while result in satisfactory removal of the coating when the wafer speed is then accelerated up to about 2000 rpm following the dispensing period.

While the foregoing description has illustrated a preferred removal of the coating from the end edge and periphery of the coated wafer using a chemical technique which lends itself to automation, other techniques may also be successfully applied.

For example, similar results may be obtained if a substrate coated with a photoresistive coating is selectively exposed to light to develop the photoresistive coating while masking the central portion of the top coated surface of the wafer, e.g., masking a 4" diameter wafer with a circular mask of 3½ to 3⅞" diameter while exposing the unmasked coating on the wafer (including the end edge and bottom surface of the wafer) to light. The exposed wafer is then run through a positive resist developer tank to remove the exposed and developed photoresist as is well known to those skilled in the art. Alternatively, a negative resist may be used with a negative developer to accomplish the same results. The resultant wafer, having the coating removed from the end edge as well as a peripheral band on both surfaces, may then be processed in normal fashion with the risk of inadvertent dislodgment of coating materials from the periphery of the substrate or wafer during processing greatly reduced.

While the invention has been described with respect to preferred embodiments, minor modifications to the invention which do not depart from the spirit of the invention are deemed to be within the scope of the invention which is to be limited only by the appended claims.

What is claimed is:

1. An improved process for the production of a plurality of semiconductor devices from a single substrate wherein a substrate is coated with a photosensitive coating material, exposed to a selective light pattern, and then treated with a chemical developer to remove portions of said coating to permit further processing of selective substrate portions, the improvement comprising:
    (a) exposing at least one surface of said substrate adjacent the peripheral edge thereof to a light pattern capable of rendering peripheral portions of said coating material into a more easily removable form than the remainder of said coating material; and
    (b) selectively removing peripheral portions of said coating material by developing said exposed photosensitive coating material;
whereby the removal of said coating material from the peripheral edge of the substrate mitigates the inadvertent dislodgement of coating particles from the peripheral portion of said substrate during subsequent processing of said coating substrate.

2. The process of claim 1 wherein said step of exposing said coated substrate material comprises exposing the peripheral edges of said coated substrate to light while masking the remainder of said coating and the step of removing said coating comprises contacting said coated substrate with a developer solution which will selectively remove the portion of said coating exposed to light.

3. The process of claim 1 wherein said step of exposing said coated substrate material comprises exposing said coated substrate to light while masking peripheral portions of said coating and the step of removing said coating comprises contacting said coated substrate with a developer solution which will selectively remove the portion of said coating not exposed to light.

4. A process for the selective removal of coating material from a peripheral portion of a coated substrate to reduce inadvertent dislodgement of portions of said coating during processing of the substrate which comprises:
    (a) contacting one surface adjacent the periphery of said substrate with a chemical capable of dissolving said coating material by forming a meniscus between one of said surfaces and a nozzle positioned adjacent the periphery of said surface whereby the meniscus provides a constant flow of said chemical onto said substrate surface;
    (b) controlling the amount of surface contacted by said chemical by rotating said substrate during said contacting at a preselected speed sufficient to permit migration of said chemical around the end edge of said substrate and onto a preselected peripheral portion of the opposite surface of said coated substrate to permit dissolution and removal of said coating on the surfaces adjacent to the end edge of said substrate;
    (c) recontacting said one surface of said coated substrate adjacent the periphery with said chemical capable of dissolving said coating material by reforming said meniscus; and
    (d) rotating said substrate at a preselected second speed faster than said first speed, but sufficient to permit migration of said chemical around the end edge of said substrate and onto a smaller preselected peripheral portion of said opposite surface;
whereby portions of said coating material on the end edge of said substrate and adjacent the periphery of said opposite surface not removed by said first contacting will be removed by said second contacting to provide a coated substrate having a peripheral band on at least one surface thereof substantially free of coating material.

5. A process for the selective removal of coating material from peripheral portions of a coated substrate to reduce inadvertent dislodgement of portions of said coating during processing of the substrate comprises:
    (a) contacting one surface adjacent the periphery of said substrate with a chemical capable of dissolving said coating material by forming a meniscus between one of said surfaces and a nozzle positioned adjacent the periphery of said surface whereby the meniscus provides a constant flow of said chemical onto said substrate surface;
    (b) controlling the amount of surface contacted by said chemical by rotating said substrate during said contacting at a preselected speed sufficient to permit migration of said chemical around the end edge of said substrate and onto a preselected peripheral portion of the opposite surface of said coated substrate to permit dissolution and removal of said contacted coating; and
    (c) rotating said substrate at a substantially greater speed for a period of at least 3 seconds after the flow of said chemical through said nozzle means stops to permit centrifugal removal of said chemical and said dissolved coating material from said peripheral surface portions;

whereby said coating material on the end edge of said substrate and on a preselected peripheral portion of each of said surfaces of said substrate is removed.

6. A process for the selective removal of coating material from peripheral portions of a coated substrate to reduce inadvertent dislodgement of portions of said coating during processing of the substrate comprises:
  (a) contacting one surface adjacent the periphery of said substrate with a chemical capable of dissolving said coating material by forming a meniscus between one of said surfaces and a nozzle positioned adjacent the periphery of said surface whereby the meniscus provides a constant flow of said chemical onto said substrate surface;
  (b) controlling the amount of surface contacted by said chemical by rotating said substrate during said contacting at a preselected speed sufficient to permit migration of said chemical around the end edge of said substrate and onto a preselected peripheral portion of the opposite surface of said coated substrate to permit dissolution and removal of said coating on the surfaces adjacent to the end edge of said substrate;
  (c) rotating said substrate at a substantially greater speed for a period of at least 3 seconds after the flow of said chemical through said nozzle means stops to permit centrifugal removal of said chemical and said dissolved coating material from said peripheral surface portions;
  (d) recontacting said one surface adjacent the periphery of said substrate with a chemical capable of dissolving said coating material by re-establishing said meniscus between said one surface and a nozzle positioned adjacent the periphery of said surface whereby said meniscus again provides a constant flow of said chemical onto said substrate surface;
  (e) controlling the flow of said chemical to a smaller amount of surface than in said first contact by rotating said substrate during said second contacting at a preselected speed slightly higher than the first speed to permit migration of said chemical around the end edge of said substrate and onto a smaller preselected peripheral portion of the opposite surface of said coated substrate to permit dissolution and removal of any remaining amounts of said coating on the surfaces adjacent to the end edge of said substrate not removed by said first contacting step;

whereby said coating material on the end edge of said substrate and on a preselected peripheral portion of each of said surfaces of said substrate is removed.

7. The process of claim 5 which includes forming said meniscus with a thickness of from 0.15 to 0.20 mm between said nozzle end and said substrate surface.

8. The process of claim 5 wherein said coating material comprises a photosensitive organic coating material.

9. The process of claim 8 wherein said chemical is a solvent capable of dissolving said photosensitive organic chemical coating material.

10. The process of claim 5 which includes rotating said substrate at a speed sufficient to permit contacting said opposite surface for a distance of from 2.54 to 5.1 millimeters from the end edge of said substrate.

11. The process of claim 5 which includes contacting said surfaces of said substrate with said chemical for a period of from about 2 to 10 seconds.

12. The process of claim 5 which includes the further step of rotating said substrate at a substantially greater speed for a period of at least 3 seconds after the flow of said chemical through said nozzle means stops to permit centrifugal removal of said chemical and said coating material from said peripheral surface portions.

* * * * *